(12) United States Patent
Satitpunwaycha

(10) Patent No.: US 8,709,270 B2
(45) Date of Patent: Apr. 29, 2014

(54) MASKING METHOD AND APPARATUS

(75) Inventor: Peter Satitpunwaycha, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 124 days.

(21) Appl. No.: 13/324,818

(22) Filed: Dec. 13, 2011

(65) Prior Publication Data

US 2013/0149868 A1    Jun. 13, 2013

(51) Int. Cl.
*H01J 37/32*     (2006.01)
*H01L 21/31*     (2006.01)
*H01L 21/311*    (2006.01)

(52) U.S. Cl.
CPC ......... *H01J 37/32623* (2013.01); *H01J 37/321* (2013.01); *H01L 21/31116* (2013.01)
USPC ............. 216/71; 216/67; 216/68; 216/70

(58) Field of Classification Search
None
See application file for complete search history.

(56) References Cited

U.S. PATENT DOCUMENTS

| | | | |
|---|---|---|---|
| 7,084,445 B2 | 8/2006 | Takeuchi et al. | |
| 7,867,904 B2 | 1/2011 | Chiang et al. | |
| 2002/0005252 A1* | 1/2002 | Masuda et al. | 156/345 |
| 2006/0102286 A1* | 5/2006 | Kim | 156/345.35 |
| 2006/0249372 A1 | 11/2006 | Xiang et al. | |
| 2008/0102538 A1* | 5/2008 | Chang et al. | 438/5 |
| 2010/0239746 A1 | 9/2010 | Yamazaki et al. | |

\* cited by examiner

*Primary Examiner* — Shamim Ahmed
*Assistant Examiner* — Bradford Gates

(57) ABSTRACT

A chamber for combinatorially processing a substrate is provided. The chamber includes a first mask and a second mask that share a common central axis. The first mask and the second mask are independently rotatable around the common central axis. The first mask has a first plurality of radial apertures and the second mask has a second plurality of radial apertures. An axis of the first plurality of radial apertures is offset from an axis of the second plurality of radial apertures. A substrate support that is operable to support a substrate below the first and second masks is included. The substrate support shares the common central axis.

8 Claims, 7 Drawing Sheets

MASKING METHOD AND APPARATUS

BACKGROUND

Combinatorial processing enables rapid evaluation of semiconductor processes. The systems supporting the combinatorial processing are flexible to accommodate the demands for running the different processes either in parallel, serial or some combination of the two.

Physical vapor deposition (PVD) is commonly used within the semiconductor industry, as well as within solar, glass coating, and other industries, in order to deposit a layer over a substrate. Sputtering is a common physical vapor deposition method, where atoms or molecules are ejected from a target material by high-energy particle bombardment and then deposited onto the substrate.

As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

The equipment performing the combinatorial processing is continually undergoing improvements in order to enable further flexibility and gain efficiency in the manufacturing processes. It is within this context that the embodiments arise.

SUMMARY

Embodiments of the present invention provide an apparatus and method for employing masks to enable further flexibility and efficiencies for combinatorial processing. Several inventive embodiments of the present invention are described below.

In some embodiments of the invention a chamber for combinatorially processing a substrate is provided. The chamber includes a first mask and a second mask. The first mask and the second mask share a common central axis. The first mask and the second mask are independently rotatable around the common central axis. The first mask has a first plurality of radial apertures disposed therethrough and the second mask has a second plurality of radial apertures disposed therethrough. An axis of the first plurality of radial apertures is offset from an axis of the second plurality of radial apertures. The axis of the first plurality of radial apertures and the axis of the second plurality of radial apertures are offset from the common central axis. A substrate support that is operable to support a substrate below the first and second masks is included. The substrate support shares the common central axis, where rotation of the first mask and rotation of the second mask isolate different regions of the substrate to enable the different regions of the substrate to be processed differently.

In some embodiments a method for processing a substrate is provided. The method includes receiving a substrate onto a stationary substrate support and positioning a first mask over and spaced apart from a surface of the substrate. The first mask has a first set of radially disposed apertures extending through a surface of the first mask. The method includes positioning a second mask over a surface of the first mask. The second mask has a second set of radially disposed apertures extending through a surface of the second mask, wherein an axis of the first set of radially disposed apertures is different than an axis of the second set of radially disposed apertures. The method includes processing a first region of the substrate. The first region is defined by one of the first set of radially disposed apertures and one of the second set of radially disposed apertures. The first mask or the second mask is rotated and a second region of the substrate is processed, where the processing of the second region of the substrate has a varied processing parameter as compared to the processing of the first region.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
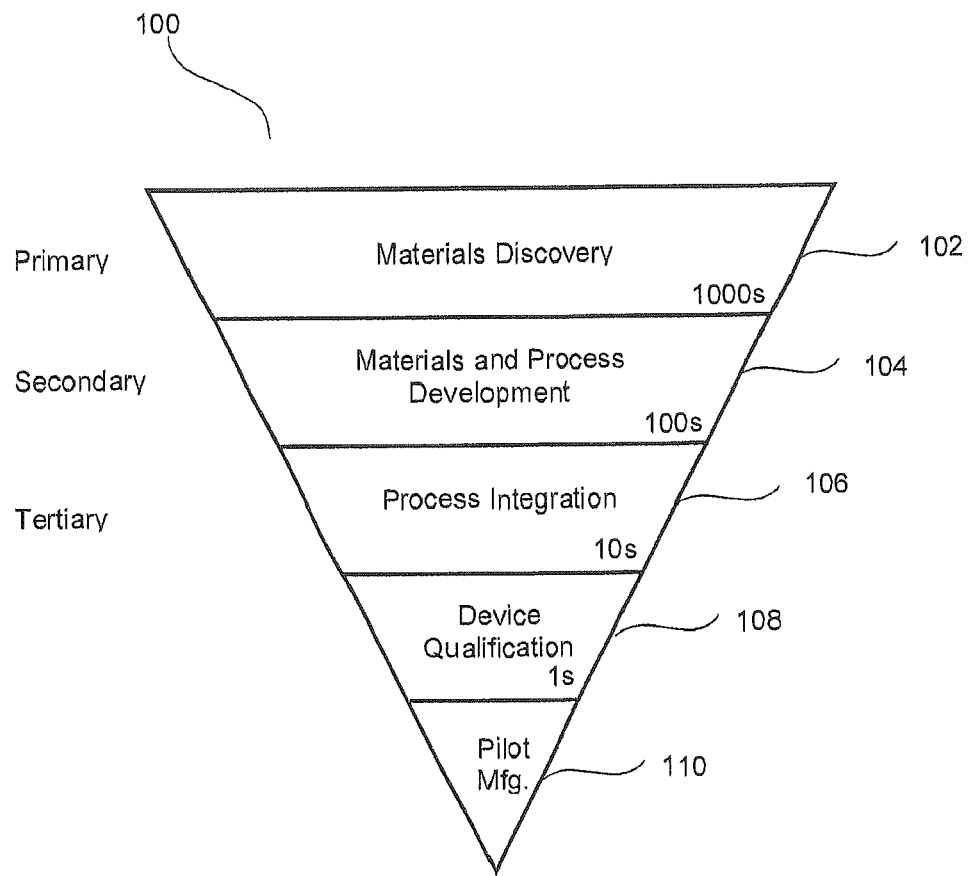
FIG. 1 illustrates a schematic diagram for implementing combinatorial processing and evaluation using primary, secondary, and tertiary screening.

The embodiments described herein provide a method and apparatus for combinatorially processing substrates. It will be obvious, however, to one skilled in the art, that the present invention may be practiced without some or all of these specific details. In other instances, well known process operations have not been described in detail in order not to unnecessarily obscure the present invention.

The embodiments describe a method and apparatus for combinatorial processing of a substrate through a dry processing technique such as an etch or deposition process. In some embodiments, the technique includes utilization of a plurality of masks where apertures or openings in the masks are radially disposed along a surface of the masks. The radially disposed apertures are offset from a central axis of the respective masks and the axes for the radial apertures are offset from each other for each mask of the plurality of masks. Through this configuration any region of the wafer or substrate is capable of being processed in a site isolated manner, as each mask is independently rotatable through a respective drive. The masking technique and apparatus is optimally designed for combinatorial processing systems and enables a smaller footprint as the substrate support may be stationary due to the configuration of the masks. In some embodiments, the masks and the substrate being processed all share a central axis and this alignment enables the chamber to have a reduced footprint. It should be appreciated that where the masks are utilized in an etch chamber, the masks are cleaned by the plasma and reactive species of the etch process.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
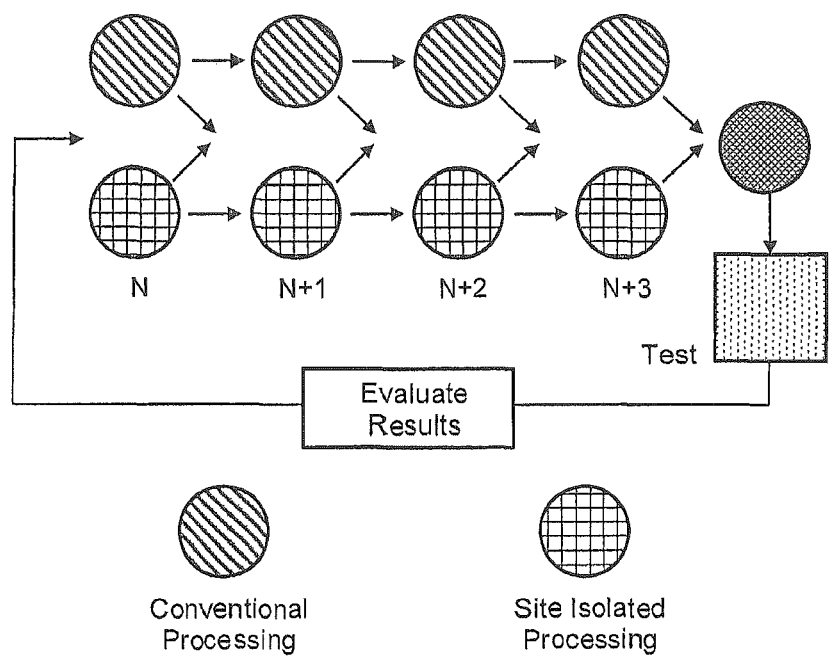
FIG. 2 is a simplified schematic diagram illustrating a general methodology for combinatorial process sequence integration that includes site isolated processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In some embodiments, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in some embodiments or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
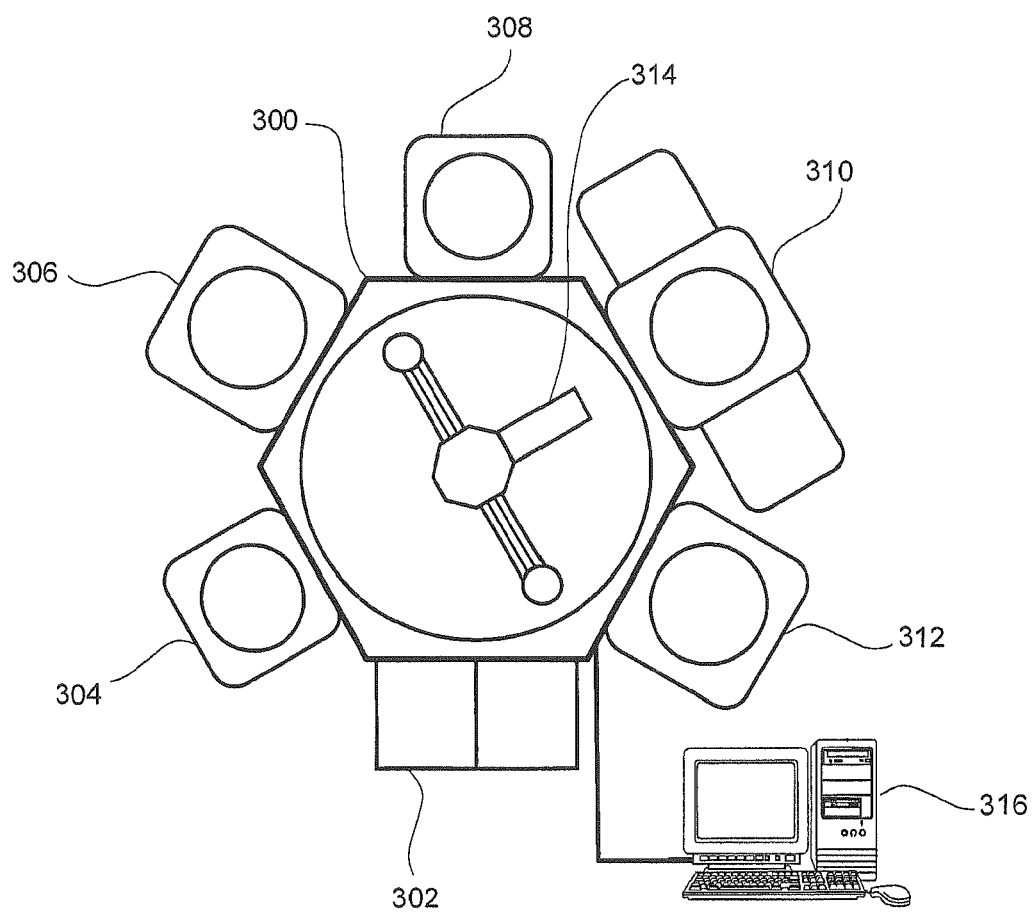
FIG. 3 is a simplified schematic diagram illustrating an integrated high productivity combinatorial (HPC) system in accordance with some embodiments of the invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 4:
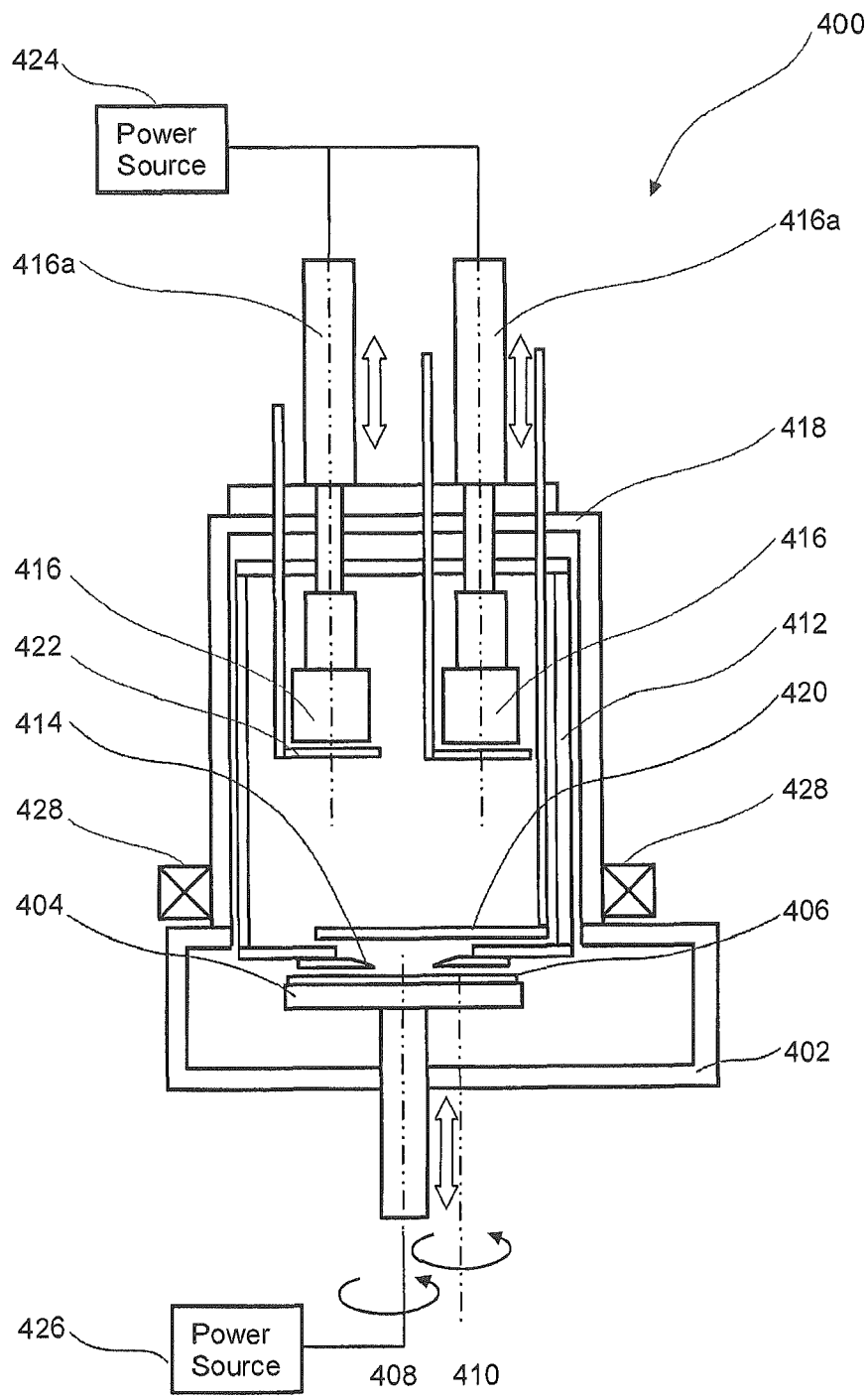
FIG. 4 is a simplified schematic diagram illustrating a sputter chamber configured to perform combinatorial processing and full substrate processing in accordance with some embodiments of the invention.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. In some embodiments, substrate support 404 is stationary and the central axis of the substrate support is aligned with masks utilized for processing a substrate as described below. Power source 426 provides a bias power to substrate support 404 and substrate 406, and produces a negative bias voltage on substrate 406. In some embodiments power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424. Further details of the power sources and their operation may be found in U.S. patent application Ser. No. 13/281,316 entitled "High Metal Ionization Sputter Gun" filed on Oct. 25, 2011 and is herein incorporated by reference.

Substrate 406 may be a conventional round 200 mm, 300 mm, or any other larger or smaller substrate/wafer size. In other embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. In alternative embodiments, the base of process kit shield is replaced by independently rotatable masks configured to access and expose a desired region of substrate 406 as described below.

A gun shutter, 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck to bias the substrate when necessary. It should be appreciated that power source 424 may output a direct current (DC) power supply or a radio frequency (RF) power supply.

Chamber 400 includes auxiliary magnet 428 disposed around an external periphery of the chamber. The auxiliary magnet 428 is located in a region defined between the bottom surface of sputter guns 416 and a top surface of substrate 406. Magnet 428 may be either a permanent magnet or an electromagnet. It should be appreciated that magnet 428 is utilized to provide more uniform bombardment of Argon ions and electrons to the substrate in some embodiments. In addition, auxiliary magnet may be disposed proximate to substrate support 404. Alternatively, auxiliary magnet may be integrated within substrate support 404.

Figure 5:
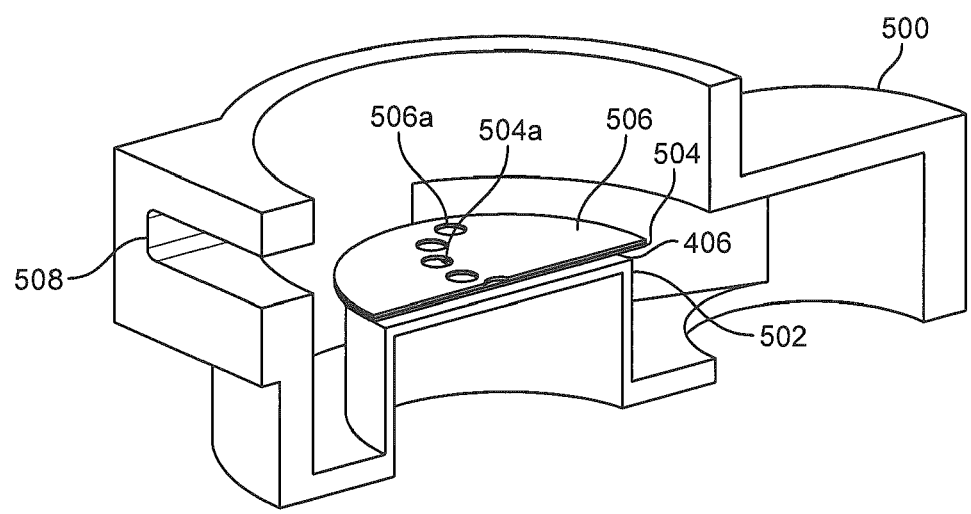
FIG. 5 is a simplified schematic diagram illustrating a cross-sectional view of an etch chamber in accordance with some embodiments of the invention.

FIG. 5 is a simplified schematic diagram illustrating a cross-sectional view of an etch chamber in accordance with some embodiments of the invention. Chamber 500 includes a stationary substrate support 502 supporting substrate 406. Disposed over substrate 406 is mask 504. Mask 506 is disposed over mask 504 and may be spaced apart from each other. In some embodiments, a surface of mask 504 contacts a surface of mask 506. It should be appreciated that a bottom surface of mask 504 is spaced apart from a top surface of substrate 406. As described below, masks 504 and 506 are independently rotatable in order to expose a desired region of substrate 406 processing in etch chamber 500. Through the rotation of masks 504 and 506 a plasma generated within chamber 500 can access a region of substrate 406 exposed when one of the apertures 506a of mask 506 align with one of the apertures 504a of mask 504. In the embodiment of FIG. 5, substrate 406, mask 504, and mask 506 each share a common central axis. Chamber 500 includes slot opening 508 that enables access to and from the chamber. It should be appreciated that substrate 406 and masks 504 and 506 may be loaded into chamber 500 and removed from the chamber through a robot, such as an end effector.

Figure 6A:
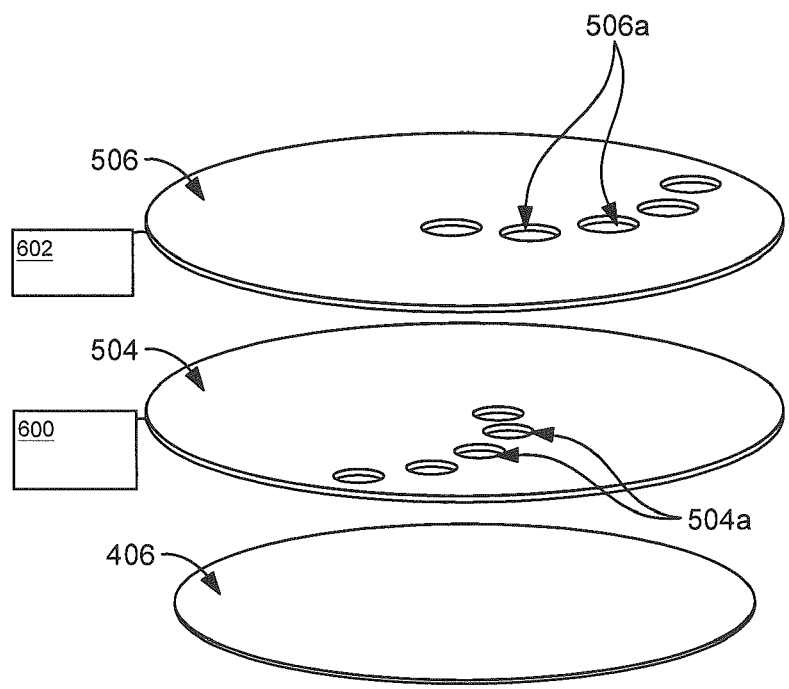
FIGS. 6A through 6D illustrate various configurations of the wafer masks over the substrate in accordance with some embodiments of the invention.

FIGS. 6A through 6D illustrate various configurations of the wafer masks over the substrate in accordance with some embodiments of the invention. In FIG. 6A, substrate 406 is disposed under mask 504 which is disposed under mask 506. Mask 504 includes a plurality of apertures 504a. Apertures 504a are radially disposed along a surface of mask 504. Mask 506 includes a plurality of apertures 506a. Apertures 506a are radially disposed along the surface of mask 506. It should be appreciated that an axis for radially disposed apertures 504a is offset from an axis for radially disposed apertures 506a. Drives 600 and 602 are configured to independently rotate masks 504 and 506, respectively. It should be appreciated that drive 600 and drive 602 may be any suitable drive configured to rotate masks 504 and 506. The masks may be moved by gear drive, chain drive, or belt drive where there is contact with the mask edge or perimeter. Or the masks may be attached to and driven by vertical rods and cylinders provided it doesn't interfere with the deposition or etch process. In some embodiments, drive 600 and drive 602 are controlled through computing device 316 of FIG. 3.

Figure 6B:
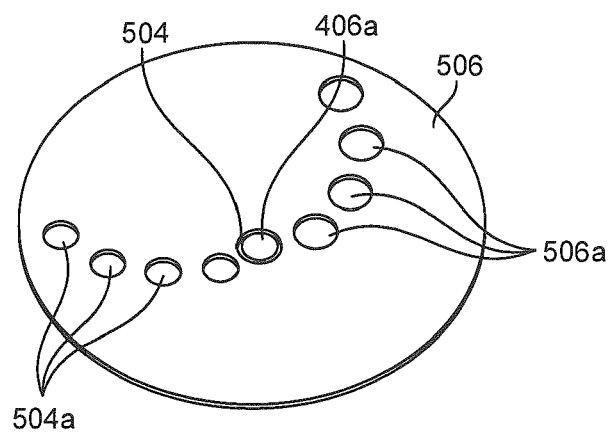
Figure 6C:
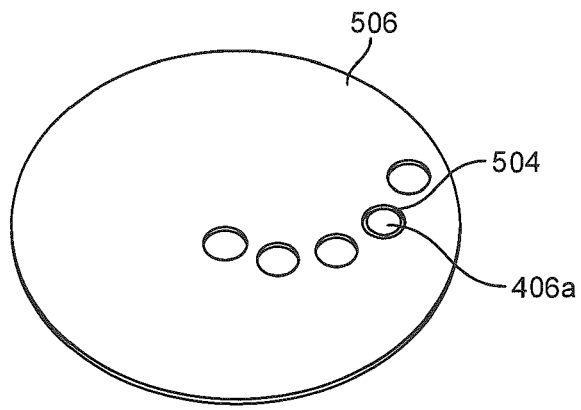
Figure 6D:
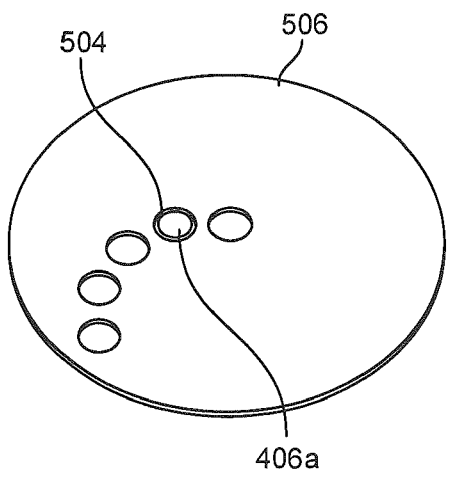

FIG. 6B through 6D illustrate the exposure of a region of the substrate through various rotations of the masks in order to expose the desired region of the substrate in accordance with some embodiments of the invention. In FIG. 6B mask 506 is disposed over mask 504 and a discrete region 406a of the substrate is exposed. In FIG. 6B a top surface of mask 506 is made transparent in order to view apertures 504a of mask 504. As illustrated in FIG. 6B, mask 504 and mask 506 are rotated to expose region 406a of the substrate. In some embodiments a size of apertures 506a, e.g., a diameter, is larger than a size of apertures 504a. It should be appreciated that while the apertures for masks 506 and 504 are illustrated as circular apertures, this is not meant to be limiting as the apertures may be any suitable geometric shape. In addition, masks 504 and 506 are illustrated as having apertures 504a and 506a radially disposed along respective surfaces. However, alternative radial dispositions may be selected as desired. In addition, masks having different shapes and sizes of apertures may be employed with the same substrate to provide different densities of spots or regions on the substrate in some embodiments. FIG. 6C illustrates mask 506 rotated clockwise approximately 60° from the position of FIG. 6B and mask 504 rotated counterclockwise 150° from the position illustrated in FIG. 6B, in order to expose a region 406a of the substrate near the substrate edge. In FIG. 6D, mask 506 is rotated clockwise approximately 120° from the position in FIG. 6C, while mask 504 is rotated counterclockwise approximately 180° from the position illustrated in FIG. 6C.

In this configuration, region 406a is exposed proximate to the location illustrated of region 406a in FIG. 6B.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for processing a substrate, comprising:
   receiving a substrate onto a stationary substrate support;
   positioning a first mask over and spaced apart from a surface of the substrate, wherein the first mask is characterized by a first central axis, the first mask having a first set of apertures extending through the first mask, wherein the first set of apertures is radially disposed about a first axis parallel to and offset from the first central axis;
   positioning a second mask over a surface of the first mask, wherein the second mask is characterized by a second central axis collinear with the first central axis, the second mask having a second set of apertures extending through the second mask, wherein the second set of apertures is radially disposed about a second axis parallel to and offset from the second central axis;
   processing a first region of the surface of the substrate, the first region defined by one of the first set of apertures and one of the second set of apertures;
   rotating one of the first mask or the second mask around the first or second central axis; and
   processing a second region of the substrate, the processing of the second region of the substrate having a varied processing parameter as compared to the processing of the first region;
   wherein the first and second regions are non-overlapping.

2. The method of claim 1, wherein the processing is a vapor deposition process.

3. The method of claim 1, wherein the processing is a plasma etch process.

4. The method of claim 1, further comprising:
   rotating both the first mask and the second mask during the processing of the second region.

5. The method of claim 4, wherein the first mask is rotated in a different direction than the second mask.

6. The method of claim 1, wherein a surface of the first mask contacts a surface of the second mask.

7. The method of claim 1, wherein the substrate support has a support central axis collinear with the first central axis.

8. The method of claim 1, wherein the varied process parameter is one of a material or an operating parameter of a chamber in which the processing of the second region is performed.

* * * * *